(12) United States Patent
Argyres

(10) Patent No.: US 6,715,137 B2
(45) Date of Patent: Mar. 30, 2004

(54) METHOD OF RESOLVING MIN-TIME VIOLATIONS IN AN INTEGRATED CIRCUIT

(75) Inventor: Dimitri C. Argyres, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/426,629

(22) Filed: May 1, 2003

(65) Prior Publication Data

US 2003/0208735 A1 Nov. 6, 2003

Related U.S. Application Data

(62) Division of application No. 09/916,544, filed on Jul. 27, 2001, now Pat. No. 6,591,404.

(51) Int. Cl.[7] .............................................. G06F 17/50
(52) U.S. Cl. .................................. 716/6; 716/2; 716/9

(56) References Cited

U.S. PATENT DOCUMENTS 6,044,209 A * 3/2000 Alpert et al. ............ 395/500.4
6,080,201 A * 6/2000 Hojat et al. ................ 703/14
6,212,666 B1 * 4/2001 Gohl et al. ................. 716/6
6,347,393 B1 * 2/2002 Alpert et al. ............... 716/2

* cited by examiner

Primary Examiner—David Nelms
Assistant Examiner—Thao P. Le

(57) ABSTRACT

A method is disclosed for resolving timing violations in a circuit design by adding de-racing buffers that slow selected signals to ensure that the signals do not arrive at a recipient state element too soon. A circuit design stored in memory has data including connectivity and timing information. This information is extracted to identify state elements with paths having min-time violations. The method attempts to resolve the min-time violations by inserting a de-racer at an instance at the end of the path, nearest the recipient state element. If the de-racer cannot be added, the method backtraces upstream along the path to the inputs of the next circuit element. The method attempts to de-race the instance by determining whether a de-racer would create a critical path. If any of the instances of the inputs cannot be de-raced, then the method backtraces again to the next upstream circuit element.

21 Claims, 9 Drawing Sheets

METHOD OF RESOLVING MIN-TIME VIOLATIONS IN AN INTEGRATED CIRCUIT

CROSS REFERENCE TO RELATED APPLICATION(S)

This application is a division of U.S. application Ser. No. 09/916,544, filed on Jul. 27, 2001, now U.S. Pat. No. 6,591,404 entitled Method of Automatically Finding and Fixing Min-time Violations, and which is hereby incorporated by reference.

TECHNICAL FIELD

The technical field generally to integrated circuit design. More particularly, the technical field relates to a method for adding de-race buffers to maintain signal integrity in a circuit design having state elements and combinatorial elements.

BACKGROUND

An electronic circuit design may comprise both state elements, such as latches, and combinatorial elements, such as logic gates. As used herein, state elements include those elements capable of storing date over multiple clock cycles. In a state element, a change on an input results in a change at the output, if any, upon the receipt of a clock signal. Combinatorial elements refer to all other circuit elements that process input signals as they are received, rather than waiting for a clock signal. A design, or a portion of a design, may include both state elements and combinatorial elements interconnected, such that an output of a state element is connected to an input of a combinatorial element, and vice versa. A single clock signal may control multiple state elements in a design.

A timing problem occurs when a signal does not propagate through the circuit within specifications of the clock. A signal may have a maximum allotted time to pass from a source, such as an upstream state element, to a receiver, such as another state element located "downstream." As used herein, that maximum time is referred to as the "max-time." For example, a design may specify that a signal reaches a certain point in the circuit, such as the next state element, during a single clock cycle or a number of clock cycles. If the signal does not reach the specified point in the circuit within the max-time, a timing problem results and the circuit design does not meet the design's frequency goals. A signal may also have a minimum time allotted to pass from a source to a state element. Even though state elements may use the same clock input, the clock may be received at one state element later than it is received at another state element, for example due to clock skew. If a signal reaches a state element before the clock cycle, it may "race" through the state element, producing an incorrect output. The minimum time, referred to as the "min-time," ensures that the signal does not reach the state elements before the appropriate clock cycle.

One way to ensure that the design meets the min-time specifications is to delay the signal by adding de-racing buffers, also referred to as "de-racers." As used herein, de-racer refers to any element that delays a signal. Existing methods and systems require designers to place de-racers manually or as part of a complicated synthesis flow. This is a difficult task because a path from a source to a state element may have multiple signals entering and exiting. In some instances, it may be desirable to have a minimum number of de-racers in the circuit, so the de-racers may be positioned directly in front of recipient state elements. However, this implementation affects all paths to that state element when only some of the paths may have min-time problems. Moreover, addition of a de-racer may cause some paths to break their max-time specifications. A designer must ensure that the de-racer not only solves the min-time violation, but also keeps the design within max-time and other specifications. Addition of a de-racer may potentially cause max-time problems for other signals. In a complex circuit, this process generally requires the designer to analyze multiple signals along a path between state elements through a process of trial and error. What is needed is a more efficient method and system for resolving min-time violations.

SUMMARY

What is disclosed is a method for testing an integrated circuit design to resolve min-time violations, including analyzing a first state element to identify a min-time violation, determining if adding a de-racer to an input gate of the first state element creates a critical path, and if a critical path is not created, adding the de-racer. If a critical path is created, the method includes backtracking to an upstream element, and determining if adding the de-racer to a first input gate of the upstream element creates a critical path.

Also disclosed is a method for resolving min-time violations in an integrated circuit design, including analyzing a first path to a first element in the circuit to identify a min-time violation, determining if the first element is a new state element if the first element is not a new state element, determining if a new global output is to be de-raced; and if the new global output is to be de-raced, backtracking through the circuit to an upstream state element.

Still further what is disclosed is a method for resolving min-time violations in an integrated circuit the method includes the steps of identifying a first element having a min-time violation, and determining if the first element can be de-raced. The step of determining if the first element can be de-raced includes determining if the first element includes a latch, if the first element includes a latch, determining if adding a de-racer creates another timing violation, if adding the de-racer creates another timing violation, returning a cannot de-race response, and if adding the de-racer does not create another timing violation, adding the de-racer.

DESCRIPTION OF THE DRAWINGS

The detailed description will refer to the following drawings in which like numerals refer to like objects, and in which.

DETAILED DESCRIPTION

Figure 1:
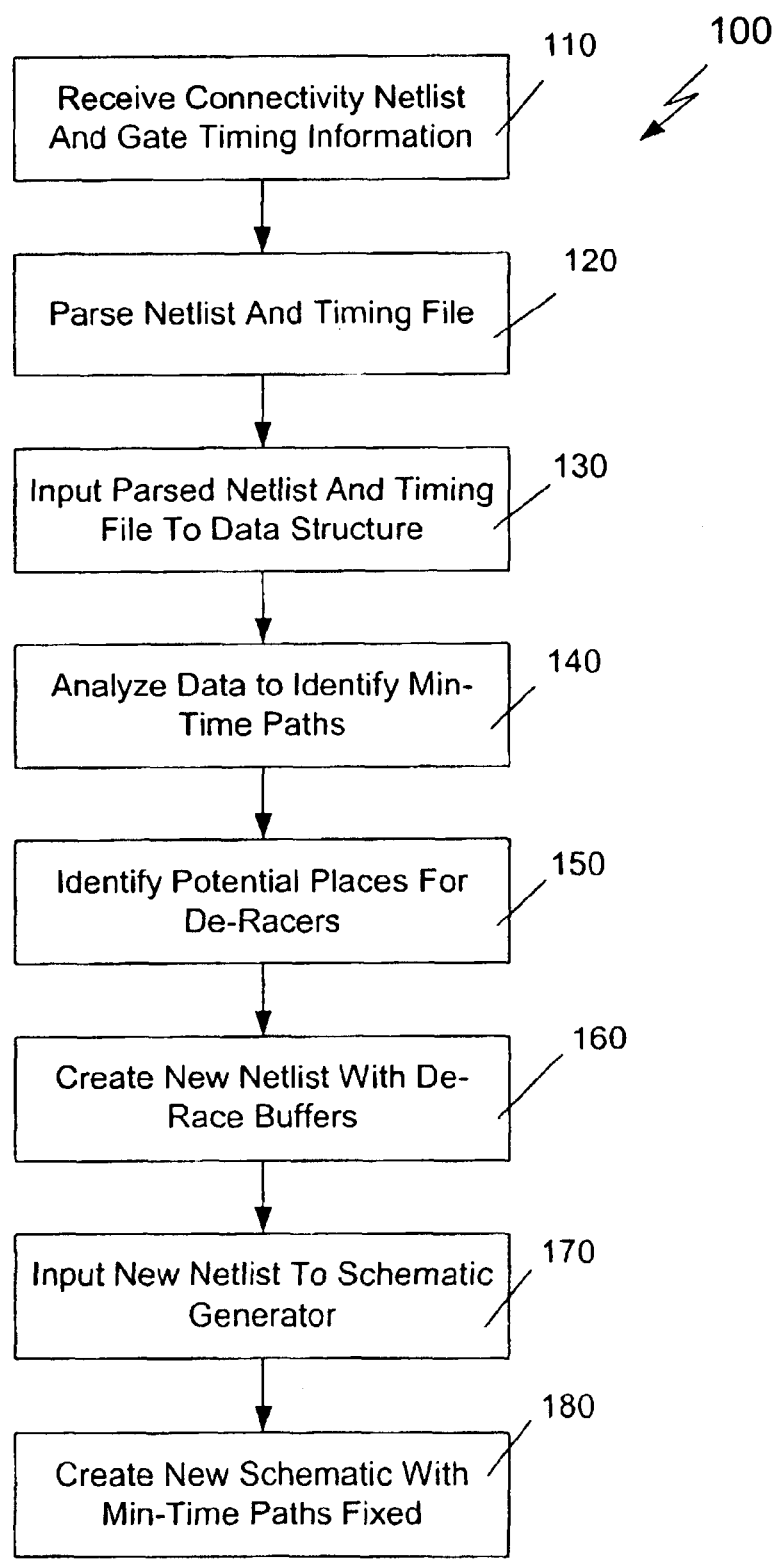
FIG. 1 shows a flow chart of the method for finding and attempting to resolve min-time violations.

FIG. 1 shows a flow chart of a method 100 for identifying and attempting to resolve min-time violations in a circuit design. The method 100 may be performed, for example, by a computer system and may be embodied in an existing software application, or may be a separate software application residing in a memory and executed by a processor. A representation of the circuit design may be stored as a data file in a computer memory. The method 100 receives 110 gate timing information from a timing file created by a timing analysis software application and connectivity information from a netlist. As used herein, a "timing analyzer" refers to any tool that extracts information about signal timing in the circuit design. As used herein, a "netlist" refers to any data structure containing information about the connectivity of circuit elements. The netlist and timing file are stored in a computer memory in one embodiment.

The netlist and timing file are parsed 120 to extract connectivity and timing information for signals. This information is input 130 into a data structure, which may also be stored in a memory. The data structure is analyzed 140 to identify min-time paths-that is, those paths between state elements that violate min-times. The method 100 then attempts to resolve the min-time violations by identifying 150 potential places for de-race buffers, also referred to as de-racers. As used herein, a de-racer refers to any element that delays a signal. A new netlist is created 160 showing connectivity of the circuit design including the de-racers. The new netlist is input 170 into a schematic generator and a new schematic is then created 180 with the min-time paths fixed.

As used herein, "state element" refers to any circuit element capable of storing data over multiple clock cycles. "Combinatorial element" refers to any circuit element that is not a state element. A "path" refers to any connection between state elements, regardless of whether that connection is direct or through one or more combinatorial elements. A path also refers to inputs to and outputs from state elements, such as those that may connect to other portions of the circuit design, and to any other inputs or outputs having a known timing. A "signal" refers to any connection between elements, either combinatorial or state elements. A path may comprise multiple signals, and a signal may be part of multiple paths.

Figure 2:
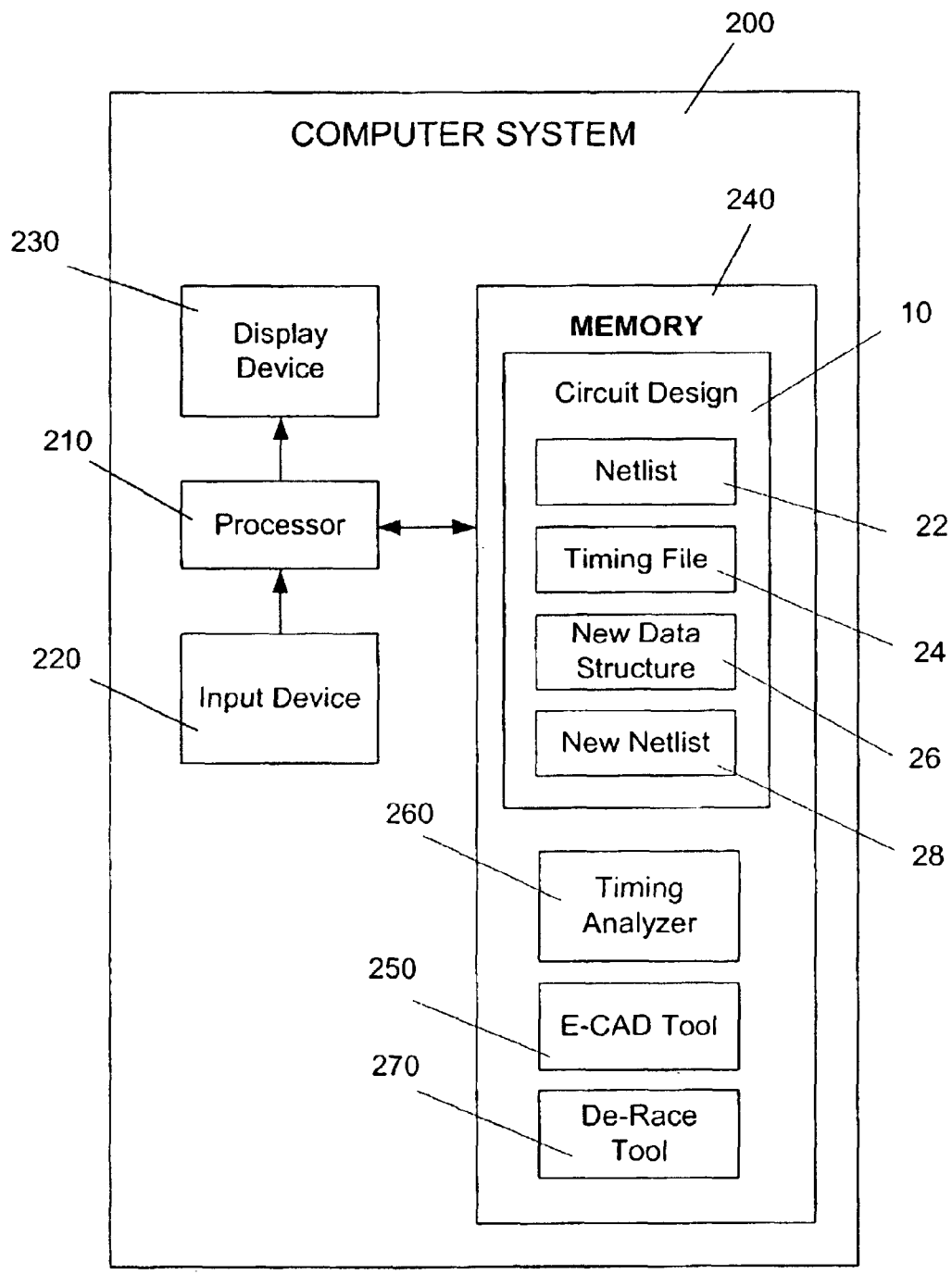
FIG. 2 shows a computer system that may be used to implement the method.

FIG. 2 shows a block diagram of a computer system 200 having a processor 210 connected to an input device 220 and a display device 230. The processor 210 accesses memory 240 in the computer system 200 that stores a circuit design 10 such as a very large scale integration (VLSI) design 10. The circuit design 10 may include, for example, a netlist 22 having connectivity information, a timing file 24 having information about the timing of paths, a new data structure 26 created by the method 100 having connectivity and timing information, and a new netlist 28 created by the method 100 having the new connectivity information including the de-racers. An electronic computer-aided design (E-CAD) tool 250 and a timing analyzer 260 are also stored in the memory 240 for analyzing the circuit model 10. The E-CAD tool 250 may include any application, such as a software application, capable of analyzing the circuit 10 and creating a netlist 22. The method 100 may also be stored as executable instructions in the memory 240 as a stand-alone application, or it may be part of a larger circuit analysis application, such as the E-CAD tool 250. In the example of FIG. 2, the method 100 is embodied in executable instructions in a stand-alone de-race tool 270 stored in memory 240. In use, the input device 220 receives commands instructing the processor 210 to call the method 100 to perform a circuit analysis on the circuit design 10. The results of the analysis may be displayed on the display device 230.

Figure 3:
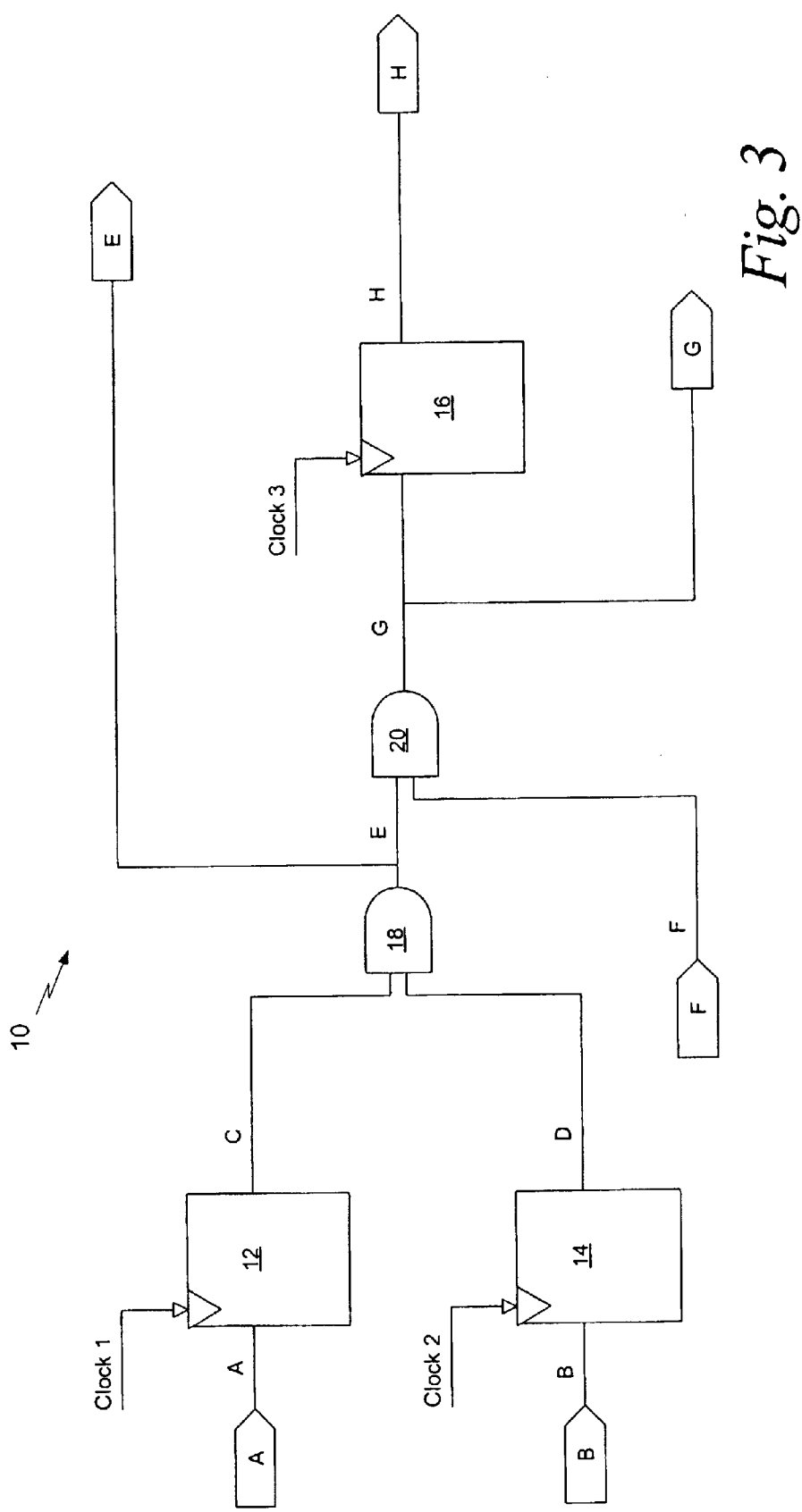
FIG. 3 shows an example circuit on which the method may be performed.

FIG. 3 shows a circuit 10 on which the method 100 may be performed. The circuit 10 may be stored as a data representation in a memory 240. The circuit 10 may be a portion of a much larger circuit stored in memory 240. The circuit 10 includes state elements 12, 14, 16, such as latches. The state elements 12, 14, 16, include clock inputs which may be the same for each of the state elements 12, 14, 16, or multiple clocks may be used in the circuit. The circuit 10 also includes combinatorial elements 18, 20, such as logical AND gates. The connections from state elements 12, 14, 16 to each other, directly or through combinatorial elements 18, 20 are referred to as paths. Connections between elements 12, 14, 16, 18, 20, whether combinatorial or state, are referred to as signals. In the example of FIG. 3, signals are indicated by letters, A–H. One path between two state elements 12, 16 comprises signals C, E, and G. Another path between two state elements 14, 16 comprises signals D, E, and G. For these paths, the state element 16 that receives the signal from the paths may be referred to as the recipient state element or the downstream state element. The state elements 12, 14 whose outputs are signals in the paths may be referred to as the sending or upstream state elements.

As shown in FIG. 3, global input signals may come into the circuit 10 under test from other parts of a much larger circuit or from an outside source, and global output signals may branch from the circuit 10 to other parts of a much larger circuit or to an external destination. In the example, Signals A, B, and F are shown as global input signals from other sources, and global output signals E, G, and H are shown leaving the circuit 10 under test to other destinations. In one convention each global signal shown coming into and going out from the circuit 10 may include timing information traced back to a state element, such that timing information for those signals represents all timing information necessary to analyze the min-time and max-time of the path. For example, other paths shown in FIG. 3 include F-G, C-E-G, D-E-G, D-E, and C-E.

Figure 4:
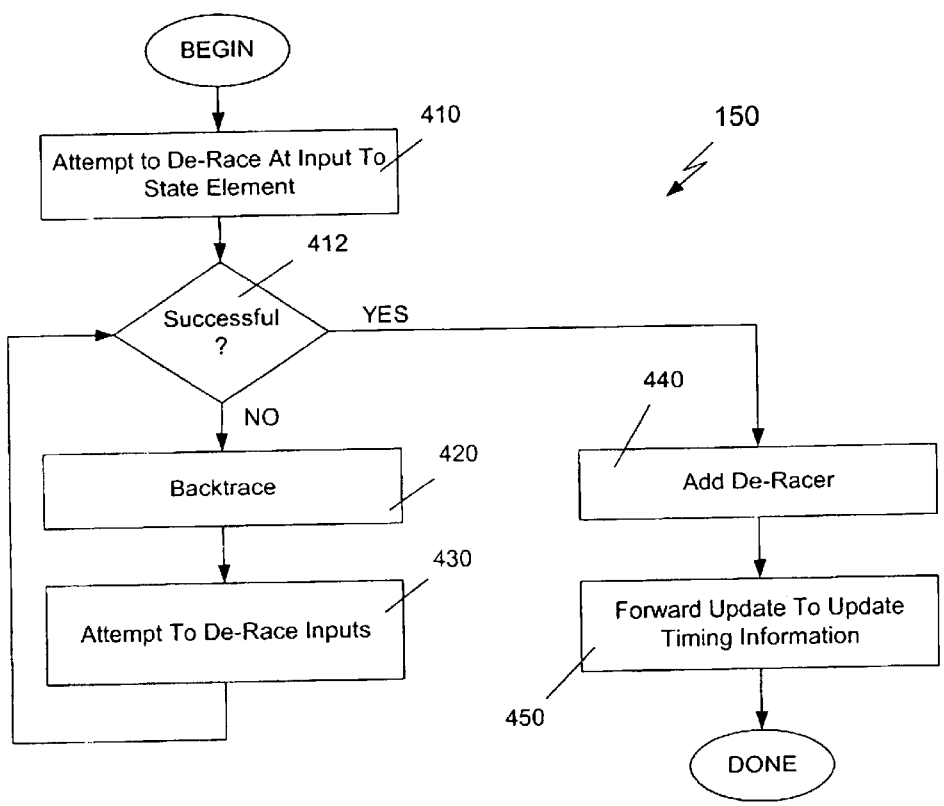
FIG. 4 shows a flow chart of the method for identifying potential places for de-racer buffers in a circuit.

FIG. 4 shows a flow chart of the method for identifying 150 potential places in the circuit 10 for de-race buffers. The method 150 may be performed, for example, by software instructions on a computer system 200 used to analyze the circuit design 10. The method 150 begins analysis at an input to the recipient, or downstream, state element 16. As used herein, circuit elements are also referred to as "instances." The inputs to the instances are also referred to as "nodes" or "signals." The method 150 first attempts 410 to position a de-racer at the input of the state element and determines 412 whether the attempt is successful. Some instances may not permit a de-racer to be added, for example, if the de-racer would cause a critical path. A critical path may be a path that becomes the longest path to a state element or that breaks a max-time violation. As used herein, a critical path refers to any path that has an undesirable design characteristic. If a de-racer can be added to the input, then the de-racer is added 440 and the method 150 updates 450 the circuit design 10 to reflect the new timing information on all forward, or downstream, signals including the delay added by the de-racer.

If a de-racer cannot be positioned at the input node of the state element 16, then the method 150 backtraces 420 upstream through the path to the inputs to the next element 20. Each input to the gate 20 is part of a separate path, one or more of which may be causing the min-time violation. The method 150 attempts 430 to position a de-racer at the input of each gate input having a min-time violation. Before an instance 20 may be de-raced, the method 150 determines 412 whether a critical path would be created by the de-racer. Because the upstream instance's inputs are not inputs of the recipient state element 16, the method 150 determines 412 the effect of a de-racer on other downstream paths, such as paths to other state elements in the circuit and global output paths (G) that do not lead to the recipient state element 16 but instead branch out to other parts of the circuit 10. If no critical paths are created, then the method 150 inserts 440 a de-racer. If a critical path is created, then the method 150 backtraces 420 upstream to all of the inputs of the driving gates 18. The process repeats itself until the path has been de-raced, or until the backtracing process reaches an upstream state element 12, 14 or a global input. The process 150 then begins with the next problematic state element, until all state elements have been processed.

As de-racers are added, the method 150 performs 450 a "forward update" function to update the circuit 10 with new timing information that reflects the delay created by the de-racers added. The addition of one de-racer may sometimes resolve other problematic paths in the circuit. In one embodiment, the forward update function 450 may be called after each de-racer is added, before other paths are analyzed. By forward updating 450 before other paths are analyzed, this embodiment is potentially more efficient if a single de-racer resolves more than one path's violation because the other paths whose violations are resolved do not require analysis by the method 150. The resulting design also has fewer de-racers, which may be desirable for a number of reasons such as reducing design area, easing routability of signals, and simplifying the design.

In one embodiment, a user can specify certain state elements or nodes to be de-raced, and the method 150 is performed beginning at each of the selected nodes. For example, a user may be analyzing a portion of a circuit having multiple global outputs that go to other portions of the circuit. The user may specify that the method 150 be performed on those global outputs.

Figure 5:
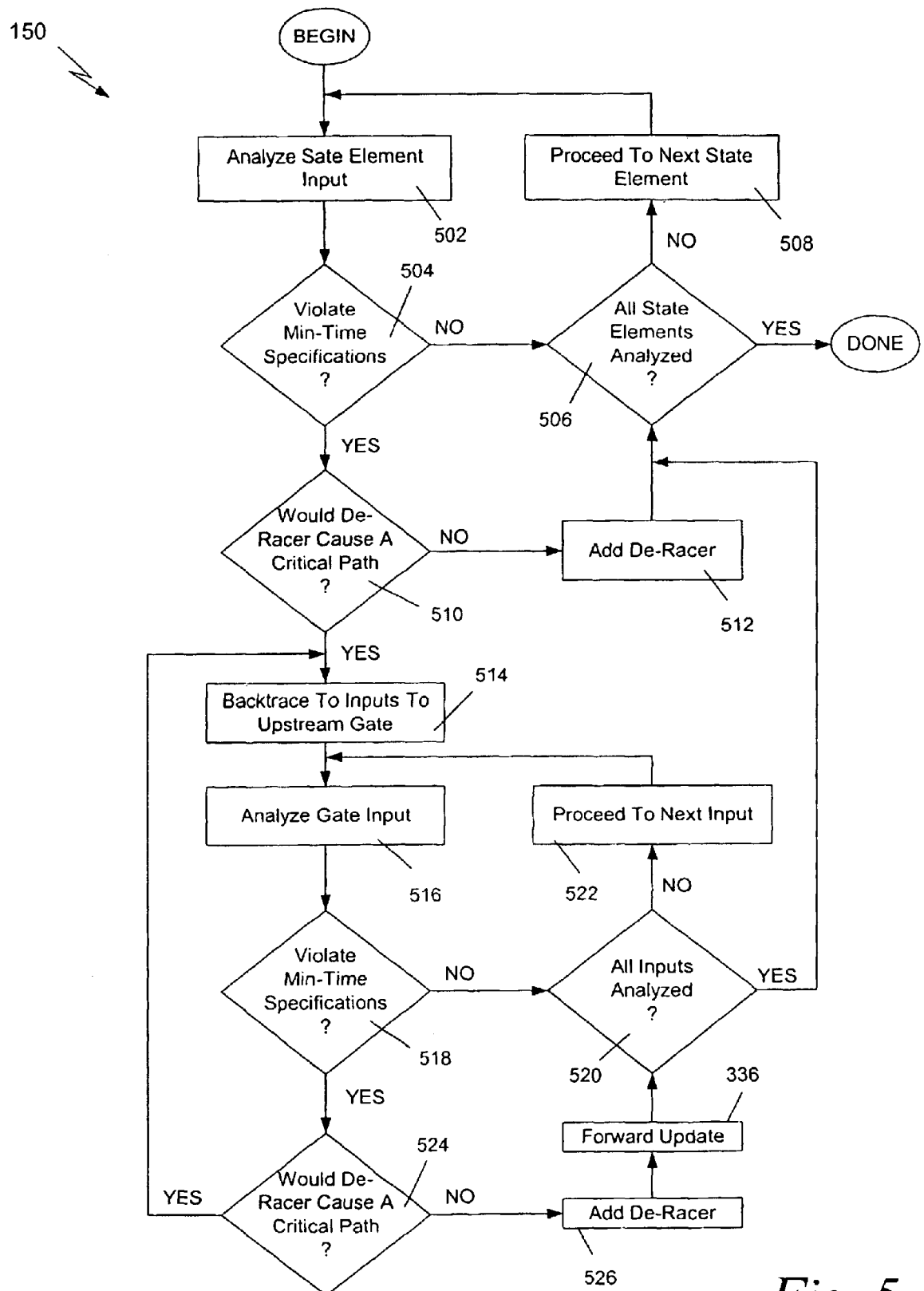
FIG. 5 shows a more detailed flow chart of the method shown in FIG. 4.

FIG. 5 shows a more detailed flow chart of the method 150 shown in FIG. 4. The method 150 first analyzes 502 the input of a recipient state element (the instance) to determine 504 if it violates a min-time specification. If it does not violate a min-time specification, then the method 150 determines 506 whether all state elements have been analyzed. If all state elements have been processed, then the method 150 is complete. If not, then the method 150 proceeds 508 to the next state element and analyzes 502 its input. In one embodiment, the method 150 may analyze each state element and/or global output in a design 10. In another embodiment, the method 150 may analyze only selected state elements or global outputs, such as the state elements and global outputs selected by a user or determined in advance to have input paths having min-time violations.

If the method 150 determines 504 that a path violates a min-time specification, then the method 150 determines 510 whether insertion of a de-racer at the instance would cause a critical path. If it would not cause a critical path, then the de-racer is added 512 and the method 150 proceeds to determine 506 whether all paths to the state element have been analyzed, and if they have not, then it proceeds 508 to the next state element. In the example of FIG. 5, the forward update function 336 is not performed if the de-racer is added 512 directly at the input of the recipient state element because the de-racer will not affect any downstream signals.

If adding a de-racer would create a critical path, then the method 150 backtraces 514 upstream through the path to the inputs of the next logic gate. The method 150 analyzes 516 each input to determine 518 whether each is part of a path that violates a min-time specification. If the path does not violate a min-time specification, then the method 150 does not need to de-race the path. The method 150 determines 520 whether all gate inputs have been analyzed. If all inputs have been analyzed, then the method determines 506 whether all state elements have been analyzed, and proceeds 508 to the next state element if they have not all been analyzed. If all inputs have not been analyzed, then the method 150 proceeds 522 to the next gate input and analyzes 516 it.

If a gate input is part of a path that violates a min-time specification 518, then the method 150 determines 524 whether adding a de-racer would create a critical path. If it would create a critical path, then the method backtraces 514 upstream to the inputs of the next logic gate in the path. If it would not create a critical path, then a de-racer is added 526 at the instance, and the forward update function 336 is called to update the timing information for the circuit. The method 150 then determines 520 whether all inputs have been processed and proceeds to the next input 522 if they have not.

One skilled in the art will recognize that de-racers may be implemented in various ways and may have various delay times. In one embodiment, many different de-racers are used having different delay times. In another embodiment, the method 150 first attempts to insert a partial de-racer having a certain delay time. If the partial de-racer will not resolve the min-time violation, then the method 150 attempts to insert a full de-racer having a greater delay. In still another embodiment, the method 150 may insert multiple de-racers at different nodes in a single path, for example, if two partial de-racers will obviate a problem created by a single full de-racer. When a de-racer may be added at an input of the recipient state element 16, one embodiment replaces state elements 16, such as latches 16, with de-raced state elements 16 or partially de-raced state elements 16 in which the delay element is built into the state element.

Figure 6:
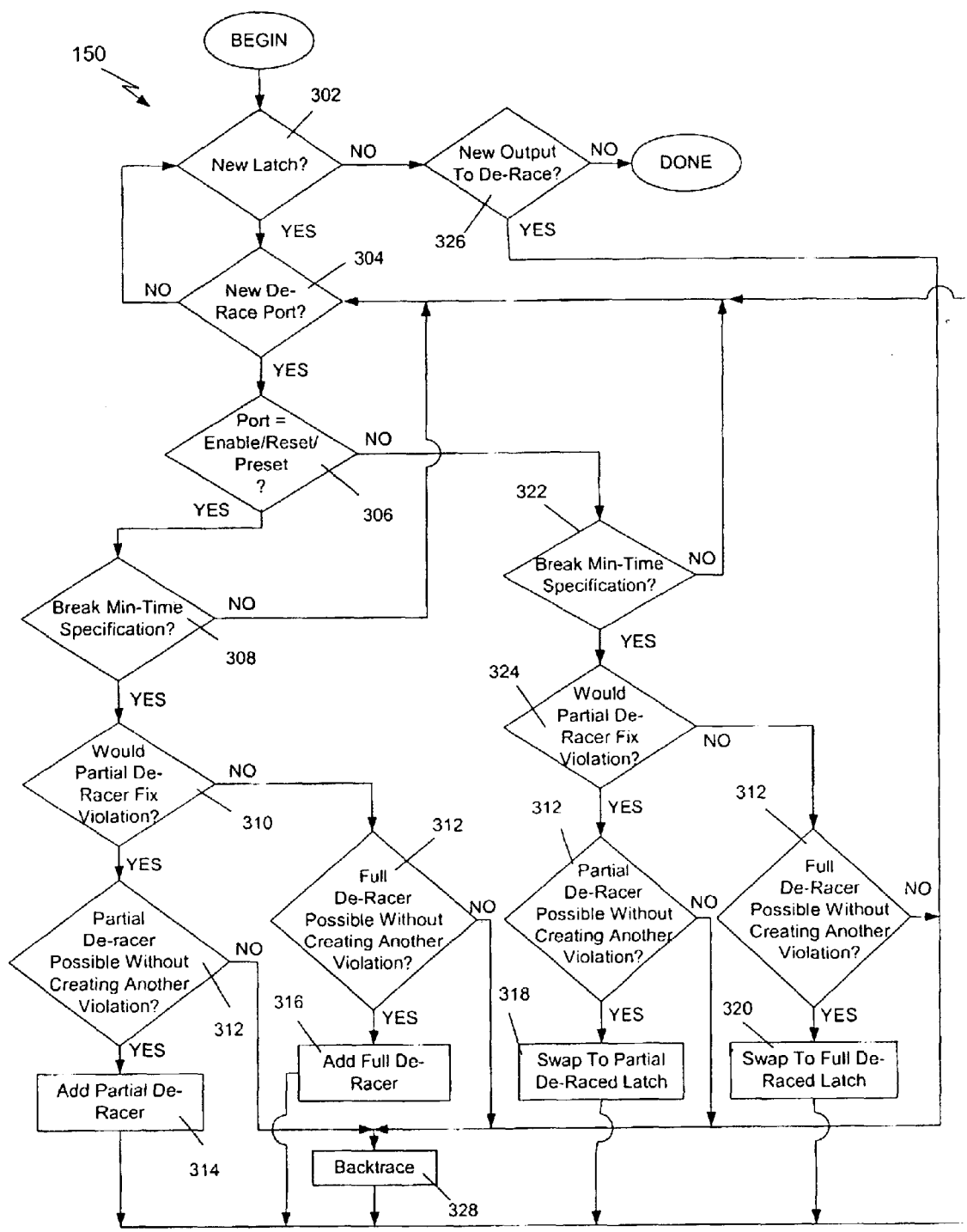
FIG. 6 shows another more detailed flow chart of the method shown in FIG. 4.

FIG. 6 shows a more detailed flow chart of one embodiment of the method 150 shown in FIGS. 4 and 5. The method 150 traces back through nodes of the circuit and determines whether a de-race buffer could be added at a particular node of an instance. The method 150 first determines 302 if the instance is a new state element, such as a latch 16. If it is not a new state element 302, then the method 150 determines 326 whether there is a new global output to be de-raced. For example, the method 100 may automatically be performed on all outputs within a portion of the circuit design 10 or on outputs selected by a user. After processing all previous state elements, the method 150 determines 326 whether other outputs must also be processed. If there is no new output, then the method 150 is complete. If there are other outputs to de-race, then the method 150 backtraces 328 through the circuit to the next instance.

If the instance is a new latch 302, then the method 150 determines 304 whether the instance is a new de-race port for the latch. A single instance may have multiple ports other than the data input. For example, other ports might include reset, preset, and enable ports. One embodiment of the method 150 analyzes each of these ports. If there are no new de-race ports to be analyzed at the instance, then the method 150 loops back to determine 302 whether there are any other latches 16 to be analyzed. If the instance has a new de-race port, then the method 150 determines 306 whether the port is an enable, a reset, or a preset, and the embodiment shown in FIG. 6 treats these types of ports differently than data ports.

If the port is an enable, a reset, or a preset, then the method 150 determines 308 whether the node is part of a path having a min-time violation. If the node does not break the min-time specification, then the method 150 does not need to de-race the port and loops back to determine 304 whether there are other ports to de-race. If the node is part of a path that violates a min-time specification, then the method 150 attempts to resolve the violation with a partial de-racer by determining 310 whether a partial de-racer would be sufficient to fix the violation. If a partial de-racer would work, then it attempts to de-race the node by determining 312 whether a partial de-racer can be applied to the node without creating another violation of the specification, for instance, without violating a max-time specification or otherwise creating a critical path. If a partial de-racer may be applied without violating another specification, then a partial de-racer is added 314 to the circuit 10 at the node of the instance. If a partial de-racer cannot be added, then the method 150 backtraces 328 to the next instance. If a partial de-racer would not resolve the min-time violation 310, then the method 150 attempts to de-race 312 using a full de-racer at the instance. If a full de-racer may be added, then it is added 316 at the instance. If a full de-racer may not be used 312, then the method 150 backtraces 328 to the next upstream instance.

If the method 150 determines 306 that the port is not an enable, a reset, or a preset, then the method 150 determines 322 whether the node is part of a path that violates a min-time specification. If there is no min-time specification violation, then the method 150 advances to the next port 304 to be analyzed. If the min-time specification is broken, then the method 150 attempts to use a partial de-racer by determining 324 whether a partial de-racer would resolve the min-time violation. If a partial de-racer would resolve the min-time violation, then the method 150 attempts to de-race 312 using a partial de-racer. In the embodiment shown in FIG. 6, if a partial de-racer may be placed at the instance, then the latch 16 is swapped 318 in the circuit design 10 with a partially de-raced latch 16, having a partial delay element inherent to the latch 16. If a de-racer may not be added at the instance, then the method 150 backtraces 328. If a partial de-racer would not resolve the min-time violation, then the method 150 attempts to de-race 312 using a full de-racer. The method 150 swaps 320 the latch 16 with a full-de-raced latch 16 if a de-racer may be added; otherwise, the method 150 backtraces 328 to the next upstream instance.

Figure 7:
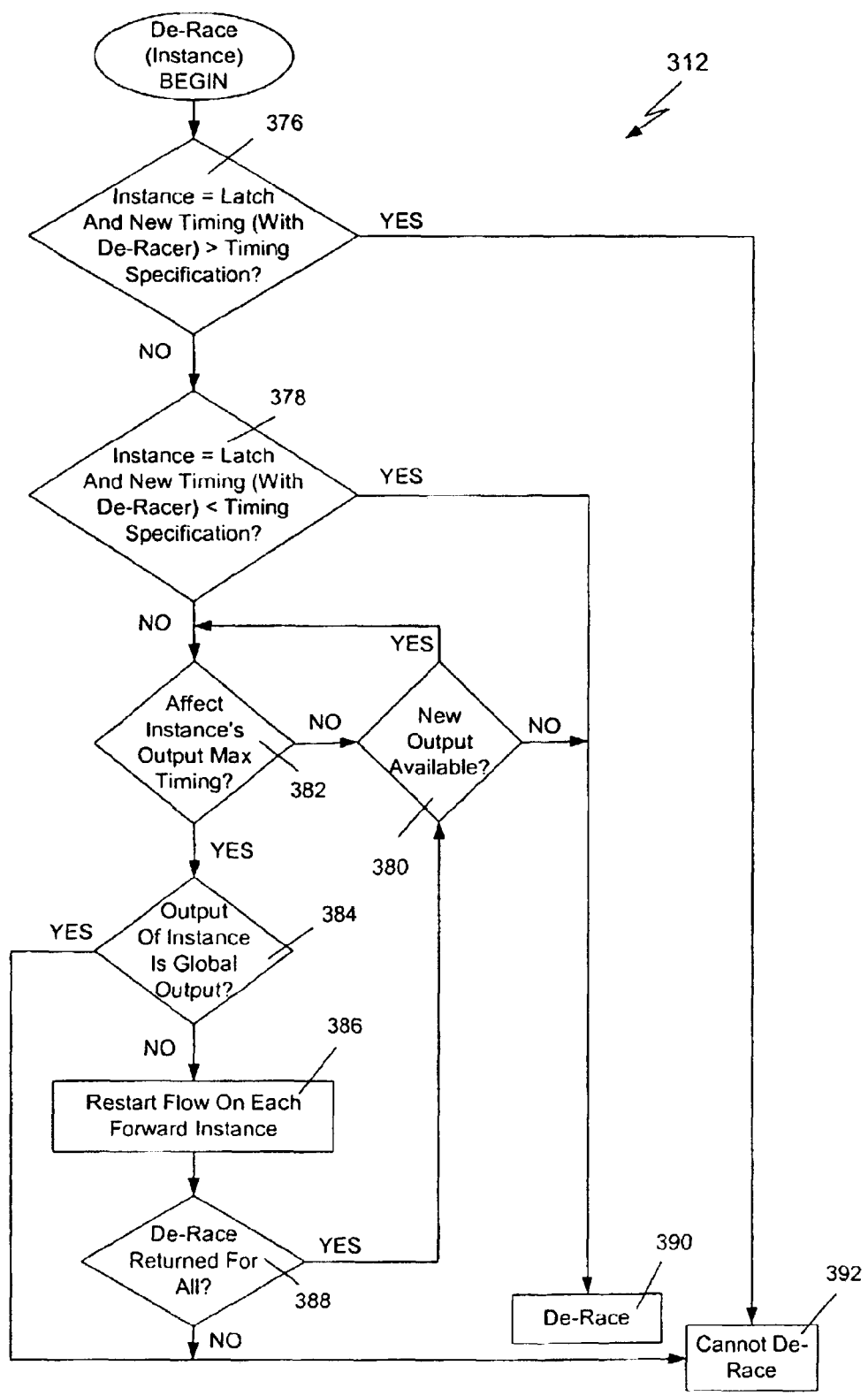
FIG. 7 shows a flow chart of the method for determining whether a de-racer buffer may be inserted at a location as shown in FIG. 6.

FIG. 7 shows a flow chart of a method 312 of determining whether an instance can be de-raced, also referred to as the de-race function 312, as shown in FIG. 6. The method 312 is applied to an input node of an instance to determine whether a full or partial de-racer may be added at the node to resolve a min-time violation without creating another violation, such as a max-time violation. The method 312 returns a "de-race" response 390 if a de-racer may be added and a "cannot de-race" response 392 if a de-racer cannot be added. These responses are then used by the general method 150 of determining where to insert a de-racer in the circuit, as shown in FIG. 6.

In the embodiment of FIG. 6, the de-race function 312 determines 376 whether the node is a latch 16 and whether the proposed new timing with a de-racer added would violate the max-time specification. If the instance is a latch 16 and the new timing would violate the max-time specification, then the de-race determination 312 returns a cannot de-race indicator 392 because addition of the de-racer to the node of the latch 16 would violate specification. If the instance is a latch 16 and the proposed new timing would not violate timing specifications, then the instance may be de-raced 390 because the addition of the de-racer at the node at the input of the de-racer would not affect other timing in the circuit 10.

If the instance is not a latch—that is, if the instance is a combinatorial element upstream from a latch, then the function 312 considers the effect of the proposed de-racer on downstream paths. In the embodiment shown in FIG. 7, if the instance is not a latch 16, then the de-race function 312 determines 382 whether addition of a de-racer would affect the maximum timing of the output of the instance. If the de-racer would not affect the instance's maximum output timing, then the method 312 determines 380 whether another output is available that must also be analyzed. Some elements may have multiple outputs, in which case one embodiment of the method 150 checks each output port. If no new output is available and a de-racer would not affect the instance's output's timing, then the instance may be de-raced 390 because downstream paths are unaffected. If a new output is available 380, then the de-race function 312 determines 382 for each such output whether the de-racer would affect the instance's maximum output timing. If the de-racer would not affect the maximum output timing on any of the outputs, then the instance may be de-raced 390.

If the addition of a de-racer would affect the maximum output timing on any output of the instance, then the de-race function 312 determines 384 whether the output of the instance is a global output. A global output refers to any output from the portion of the circuit design under test to another portion of the circuit. In the embodiment shown in FIG. 7, the method 150 does not permit de-racers to alter the timing of global output paths. In other embodiments, a more detailed analysis of the timing of global output paths may be undertaken to determine the significance of the timing change to the global output. In the embodiment of FIG. 7, if a de-racer would affect a global output, then the embodiment shown of the de-race function 312 concludes that a de-racer may not be added 392. If the de-racer would not affect a global output 384, then the de-race function 312 is called recursively 386 for each forward instance—that is, each "downstream" element receiving an output from the current instance. If the de-race function 312 run recursively 386 on each of the output recipient instances concludes for each forward instance that a de-racer may be added 388, then the de-racer may be added 390. In the embodiment shown in FIG. 7, if any of the output recipients cannot tolerate the addition of an upstream de-racer, then the de-race function concludes that a de-racer may not be added 392.

Figure 8:
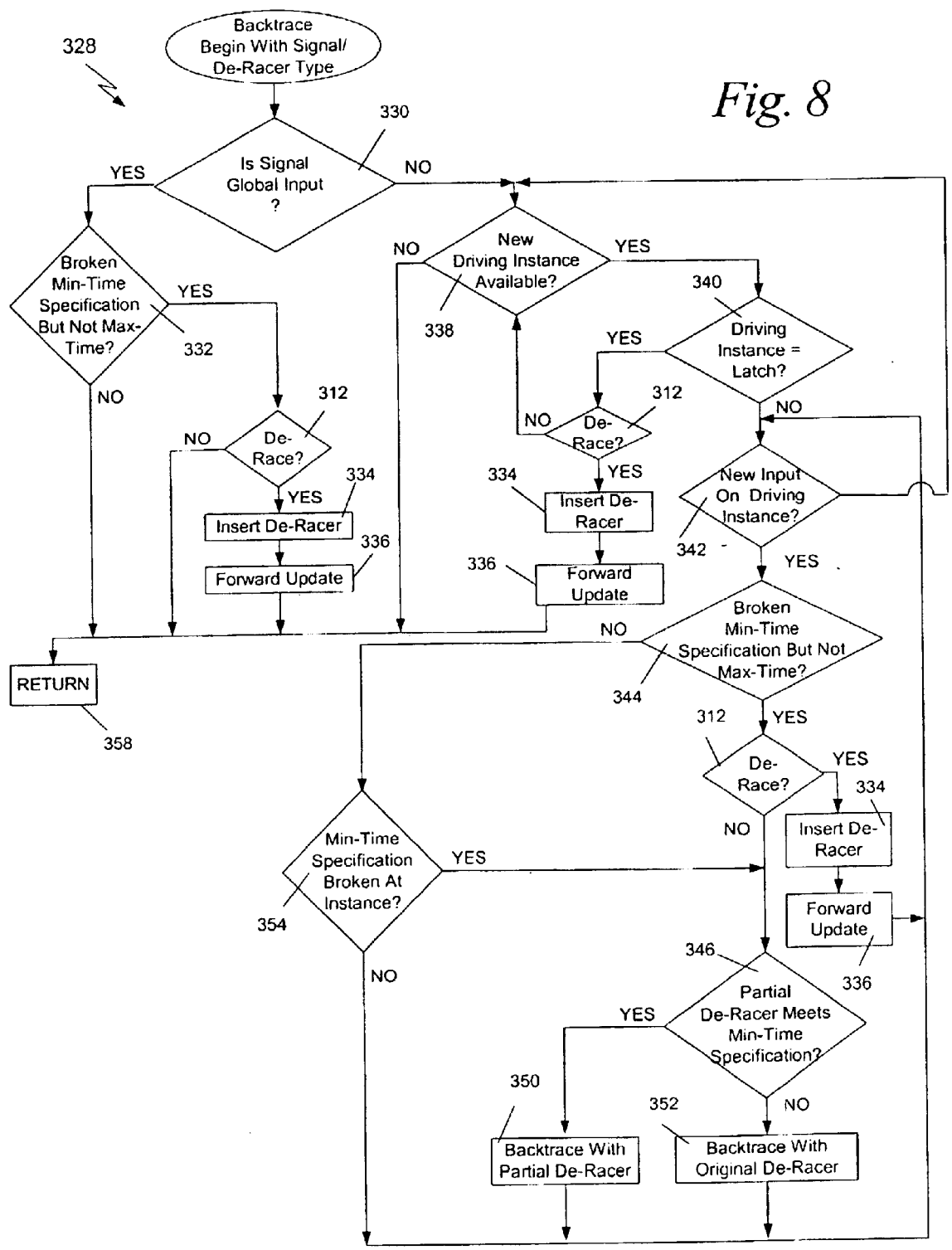
FIG. 8 shows a flow chart of the backtrace function shown in FIG. 6.

FIG. 8 shows a more detailed flow chart of one embodiment of the backtrace function 328 shown in FIG. 6. For each instance, the method 328 backtraces in the direction opposite the signal flow, from outputs to inputs, to the next upstream element. As used herein, the term "upstream element" refers to any element along a path that ordinarily receives a signal before other "downstream elements" connected to the path. The function 328 determines 330 first if the signal is a global input. A global input is any input received from another portion of the circuit design not under test. In the embodiment shown in FIG. 8, the function 328 does not attempt to backtrace 328 through parts of the circuit not under test, such as through paths along global inputs. If the signal is not a global input, then the function 328 determines 338 whether another driving instance is available. If the signal is a global input, then the function 328 determines 332 whether the min-time specification is broken but the max-time specification is not broken. If the min-time function is not broken, then the method 328 does not need to analyze the path and returns 358 to the original flow from which it was called, because there are no other driving instances to analyze. Likewise, if both the min-time and max-time specifications are broken, then a de-racer will only exacerbate the violation, so the method returns 358 to the function in the original flow of FIG. 6 that called it with the response that the signal continues to break specification and that the instance cannot be de-raced.

If the min-time function is broken but the max-time function is not broken, then the function 328 calls the de-race function 312 to determine whether or not the instance can be de-raced. If it can be de-raced, then a de-racer is inserted 334, the forward update function is called 336 to update the timing information for the circuit to include the de-racer that is inserted 334, and the function 328 returns to the original flow of FIG. 6. If a de-racer cannot be inserted at the instance, then no further backtracing is done by this embodiment and it simply returns 358 to the original flow from where it was called, as shown in FIG. 6, with the response that the signal continues to break specification and that the instance cannot be de-raced.

If the signal is not a global input, then the method 328 determines 338 whether there is another driving instance available to be analyzed. If no new driving instance is available, then the function 328 returns 358 to the flow that called the function 328. If a new driving instance is available, then the function determines 340 whether the driving instance is a latch 16. If the driving instance is a latch 16, then the method 328 calls the de-race function 312 to determine whether a de-race buffer may be added at the instance.

If a de-racer may be added, then the function 328 inserts 334 a de-racer at the instance, calls the forward update function 336 to update the circuit design 10, and returns 358 to the original flow. If a de-racer may not be added, then the function 328 again determines 338 whether there are other driving instances to analyze. When an upstream latch or a global input is reached, the embodiment shown does not attempt to backtrace further, but instead identifies the path as having a violation to be handled manually.

If the driving instance is not a latch 340, then the function 328 determines 342 whether there is another input on the driving instance to be analyzed. If there is no input on the driving instance, then the method 328 returns to determine 338 whether there is a new driving instance that needs to be analyzed. If there is an input on the driving instance, then the method 328 determines 344 whether the min-time specification is broken but the max-time specification is not broken. If the min-time specification is broken but the max-time specification is not broken, then the method 328 calls the de-race function 312 to determine whether the de-racer may be added. If a de-racer may be added, then the de-racer is inserted 334 at the instance and the forward update function 336 is called. The function 328 then returns to determine 342 whether there are other inputs on the driving instance that need to be analyzed. If a de-racer may not be added, then the method 328 determines 346 whether a partial de-racer would meet the min-time specification. If a partial de-racer would work, then the method 328 backtraces 350 with a partial de-racer. If a partial de-racer would not work, then the method 328 backtraces 352 using the original de-racer. The function 328 then returns to determine 342 whether there are other inputs on the driving instance that need to be analyzed.

If the method 328 determines 344 that the min-time specification is not broken or that the min-time specification is broken and the max-time specification is also broken, then the function 328 determines 354 whether the min-time specification is broken for the instance. If the function 328 determines 354 that the min-time specification is broken, then there is a max-time violation as well, and the method 328 proceeds to determine 346 whether a partial de-racer meets the min-time specification. The embodiment shown in FIG. 8 effectively by-passes the de-race function 312 by steps 344, 354 if there is a max-time violation because addition of a de-racer would only exacerbate the max-time violation. If the min-time specification is not broken, then the method 328 returns to determine 342 whether there is another input on the instance to be analyzed.

Figure 9:
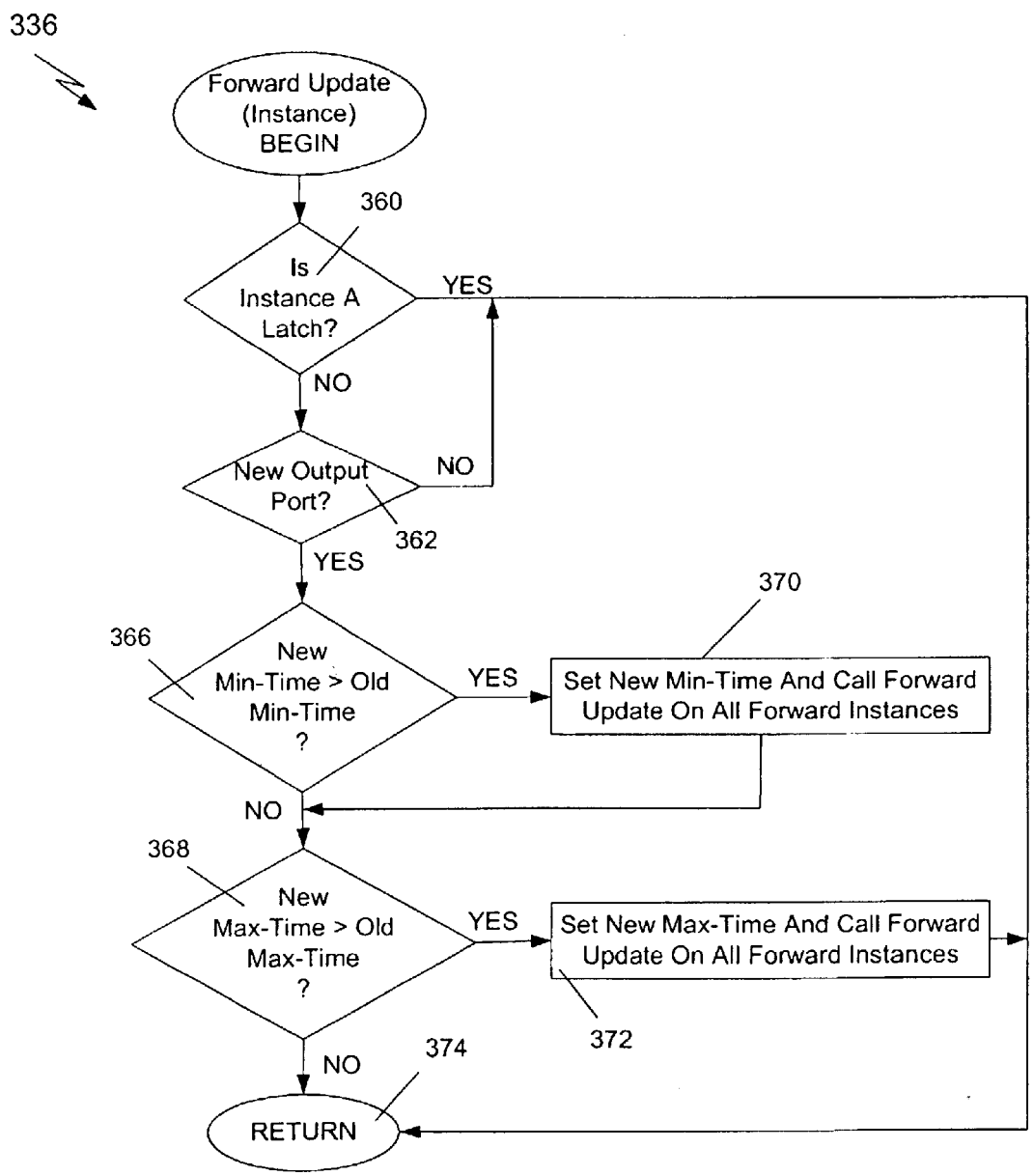
FIG. 9 shows a flow chart of the forward update function shown in FIG. 6.

FIG. 9 shows a flow chart of the forward update function 336. The function may be called by one or more of the other functions discussed herein, for example as part of the general method 150 shown in FIGS. 4–6 or the backtrace method 328 shown in FIG. 9. The forward update function 336 is called to update the timing information in the circuit design 10 for all forward instances—that is all signals downstream from the point at which the function 336 was called. For example, the forward update function 336 may be called after a de-racer is added to the design to update timing information to reflect the delay caused by the added de-racer to downstream signals.

The function 336 determines 360 whether the instance is a latch. If it is a latch 16, then the function 336 returns 374 to the place from which it was called. Once the function 336 hits an input of a latch, no further updating is required because no downstream signals are affected. If the instance is not a latch 16, then the method determines 362 whether the instance has a new output port to be analyzed. If there is a new output port to be analyzed, then the function 336 determines 366 whether the new min-time is greater than the previous min-time. If it is greater, then the new min-time is set 370 and the forward update function 336 is called on all forward instances and the function determines 368 whether the new max-time is greater than the old max-time. If the new min-time is not greater than the old min-time, then the function 336 does not change the min-time value and then determines 368 whether the new max-time is greater than the previous max-time. If it is greater than the previous max-time, then the new max-time is set 372 and the forward update function 336 is called on all forward instances and the function 336 returns 374. If the new max-time is not greater than the previous max-time, then the function 336 is complete and returns 374 to the place from which it was called.

Although the present invention has been described with respect to particular embodiments thereof, variations are possible. The present invention may be embodied in specific forms without departing from the essential spirit or attributes thereof. In addition, although aspects of an implementation consistent with the present invention are described as being stored in memory, one skilled in the art will appreciate that these aspects can also be stored on or read from other types of computer program products or computer-readable media, such as secondary storage devices, including hard disks, floppy disks, or CD-ROM; a carrier wave from the Internet or other network; or other forms of RAM or read-only memory (ROM). It is desired that the embodiments described herein be considered in all respects illustrative and not restrictive and that reference be made to the appended claims and their equivalents for determining the scope of the invention.

What is claimed is:

1. A method for testing an integrated circuit design to resolve min-time violations, comprising:

analyzing a first state element to identify a min-time violation;

determining if adding a de-racer to an input gate of the first state element creates a critical path;

if a critical path is not created, adding the de-racer; and if a critical path is created:
      backtracking to an upstream element, and
      determining if adding the de-racer to a first input gate of the upstream element creates a critical path.

2. The method of claim 1, wherein adding the de-racer to the upstream element first input gate does not create a critical path, the method further comprising adding the de-racer to the upstream element first input gate.

3. The method of claim 2, further comprising updating timing information of the integrated circuit design to reflect addition of the de-racer.

4. The method of claim 2, wherein determining the creation of a critical path comprises determining if adding the de-racer creates a path having a timing that is longer than all other paths leading to the first state element or to the upstream element.

5. The method of claim 2, wherein backtracking to an upstream element, comprises determining if a signal input to the upstream element is received from a portion of the integrated circuit design not under test.

6. The method of claim 5 wherein the signal input is received from a portion of the integrated circuit under test, the method, comprising:

determining whether the upstream element comprises a second input gate to be analyzed;

if a second input gate is available, determining if the second input gate is a latch;

if the second input gate is a latch, determining if a de-racer may be added to the second input gate; and if the de-racer may be added to the second input gate:
      adding the de-racer, and
      updating the integrated circuit design.

7. A method for resolving min-time violations in an integrated circuit design, comprising:

analyzing a first path to a first element in the circuit to identify a min-time violation;

determining if the first element is a new state element;

if the first element is not a new state element, determining if a new global output is to be de-raced; and if the new global output is to be de-raced, backtracking through the circuit to an upstream state element.

8. The method of claim 7, wherein the first element is a new state element, the method further comprising:

determining if the first element comprises a new de-race port;

if a new de-race port is determined, identifying the new de-race port.

9. The method of claim 8, wherein the new de-race port is identified as one of enable, reset, and preset, the method further comprising:

determining if the new de-race port is part of a path having a min-time violation;

if the new de-race port is part of a path having a min-time violation, determining if a partial de-racer can be added to correct the min-time violation;

if the partial de-racer can be added, determining if adding the partial de-racer creates a max-time violation;

if adding the partial de-racer does not create a max-time violation, adding the partial de-racer; and if adding the partial de-racer creates a max-time violation, backtracking to the upstream state element.

10. The method of claim 9, wherein the partial de-racer does not correct the min-time violation, the method further comprising:

determining if a full de-racer can be added to correct the min-time violation without creating a max-time violation; and if the full de-racer can be added, adding the full de-racer.

11. The method of claim 8, wherein the de-race port is not one of enable, reset, and preset, the method further comprising:

determining if the new de-race port is part of a path having a min-time violation;

determining if a partial de-racer can be added to correct the min-time violation;

if the partial de-racer can be added, determining if adding the partial de-racer creates a max-time violation;

if adding the partial de-racer does not create the max-time violation, swapping the first element with a partially de-raced element.

12. The method of claim 11, wherein the partial de-racer does not correct the min-time violation, the method further comprising:

determining if a full de-racer corrects the min-time violation;

if the full de-racer corrects the min-time violation, swapping the first element with a fully de-raced element.

13. The method of claim 11, wherein the new de-race port is a latch port.

14. A method for resolving min-time violations in an integrated circuit, comprising:

identifying a first element having a min-time violation; and determining if the first element can be de-raced, comprising:
       determining if the first element includes a latch,
       if the first element includes a latch, determining if adding a de-racer creates another timing violation,
       if adding the de-racer creates another timing violation, returning a cannot de-race response, and
       if adding the de-racer does not create another timing violation, adding the de-racer.

15. The method of claim 14, wherein the first element is a consolidated element, the method further comprising:

determining if adding the de-racer affects a maximum timing of an output of the first element;

if adding the de-racer does would not affect the maximum timing, determining if the first element has another output for analysis;

if the first element has another output, checking the other output;

if the first element does not have another output, adding the de-racer.

16. The method of claim 15, wherein adding the de-racer affects the maximum timing, the method further comprising determining if the output is a global output.

17. The method of claim 16, wherein the output is a global output, the method further comprising determining not to add the de-racer.

18. The method of claim 16, wherein the output is a global output, the method further comprising analyzing timing of global output paths.

19. The method of claim 17, wherein adding the de-racer does not affect a global output, the method further comprising recursively calling a de-race function for each element downstream of the first element.

20. The method of claim 14, wherein the de-racer cannot be added, the method further comprising backtracking to a next upstream element.

21. The method of claim 5, wherein the signal input is received from a portion of the circuit not under test, the method comprising identifying a path having a min-time violation to be handled manually.

* * * * *